United States Patent
Sverdrup, Jr. et al.

(10) Patent No.: US 6,548,751 B2
(45) Date of Patent: Apr. 15, 2003

(54) THIN FILM FLEXIBLE SOLAR CELL

(75) Inventors: Lawrence H. Sverdrup, Jr., Poway, CA (US); Norman F. Dessel, San Diego, CA (US); Adrian Pelkus, San Marcos, CA (US)

(73) Assignee: SolarFlex Technologies, Inc., San Diego, CA (US)

( * ) Notice: Subject to any disclaimer, the term of this patent is extended or adjusted under 35 U.S.C. 154(b) by 0 days.

(21) Appl. No.: 09/892,131

(22) Filed: Jun. 25, 2001

(65) Prior Publication Data

US 2003/0041894 A1 Mar. 6, 2003

Related U.S. Application Data

(60) Provisional application No. 60/254,760, filed on Dec. 12, 2000.

(51) Int. Cl.$^7$ ............. H01L 31/0272; H01L 31/0296; H01L 31/042
(52) U.S. Cl. .............. 136/260; 136/246; 136/251; 136/258; 136/259; 136/256; 136/264; 136/255; 257/53; 257/66; 257/42; 257/433; 257/434; 257/461; 257/464; 438/84; 438/98; 438/96; 438/97; 438/93; 438/94; 438/86; 438/87; 438/95; 438/64
(58) Field of Search ............... 136/245, 251, 136/258, 259, 256, 260, 264, 255; 257/53, 66, 42, 433, 434, 461, 464; 438/84, 98, 96, 97, 93, 94, 95, 64, 86, 87

(56) References Cited

U.S. PATENT DOCUMENTS

| | | | | |
|---|---|---|---|---|
| 3,472,690 A | * | 10/1969 | Hill | 136/260 |
| 4,177,473 A | | 12/1979 | Ovshinsky | 252/62.3 E |
| 4,217,374 A | | 8/1980 | Ovshinsky et al. | 438/92 |
| 4,784,701 A | * | 11/1988 | Sakai et al. | 136/249 |
| 4,816,324 A | * | 3/1989 | Berman | 428/216 |
| 5,252,142 A | * | 10/1993 | Matsuyama et al. | 136/255 |
| 5,304,499 A | | 4/1994 | Bonnet et al. | 438/94 |
| 5,378,639 A | * | 1/1995 | Sasaki et al. | 438/62 |
| 5,393,675 A | | 2/1995 | Compaan | 438/95 |
| 5,714,391 A | * | 2/1998 | Omura et al. | 438/99 |
| 6,423,565 B1 | * | 7/2002 | Barth et al. | 438/57 |

FOREIGN PATENT DOCUMENTS

| | | |
|---|---|---|
| DE | 19904082 A | 8/2000 |
| EP | 0744779 A | 11/1996 |
| EP | 0755080 A | 1/1997 |
| JP | 56032774 A | 4/1981 |

OTHER PUBLICATIONS

Nishiwaki et al, "Development of an ultralight, flexible a–Si solar cell submodule," Solar Energy Materials and Solar Cells, vol. 37, pp. 295–306, (1995).*

McClure, J.C., et al., "Foil mounted thin–film solar cells for space and terrestrial applications", Solar Energy Materials and Solar Cells, Elsevier Science Publishers, Amsterdam NL, vol. 55 No. 1–2 (Jul. 23, 1998), pp. 141–148.

Abou–Elfotouh, F. A., "RF Planar Magnetron Sputtering Of Polycrystalline CdTe Thin–Film Solar Cells," *Intl. J. Solar Energy*, vol. 12:223–231 (1992).

(List continued on next page.)

*Primary Examiner*—Alan Diamond
(74) *Attorney, Agent, or Firm*—Donn K. Harms

(57) ABSTRACT

A thin-film flexible solar cell built on a plastic substrate comprises a cadmium telluride p-type layer and a cadmium sulfide n-type layer sputter deposited onto a plastic substrate at a temperature sufficiently low to avoid damaging or melting the plastic and to minimize crystallization of the cadmium telluride. A transparent conductive oxide layer overlaid by a bus bar network is deposited over the n-type layer. A back contact layer of conductive metal is deposited underneath the p-type layer and completes the current collection circuit. The semiconductor layers may be amorphous or polycrystalline in structure.

71 Claims, 7 Drawing Sheets

OTHER PUBLICATIONS

Bonnet, Dieter, "Cadmium–telluride—Material For Thin Film Solar Cells," *ANTEC*, GmbH, Industriesr. 2, D–65779 Kelkheim, Germany; Meyers, Peter, *ITN Energy Systems*, 12401 West 49$^{th}$ Avenue, Wheatridge, CO 80033. (Date Unknown).

Compaan, Alvin D., "CdS/CdTe Solar Cells By RF Sputtering And By Laser Physical Vapor Deposition," Dept. of Physics an Astronomy, The University of Toledo, Toledo OH 43606 (1993).

Compaan, Alvin D., "High–Efficiency Thin–Film Cadmium Telluride Photovoltaic Cells," *Annual Technical Report*, Jan. 20, 1996–Jan. 19, 1997 (Aug. 1997).

Compaan Alvin D., "RF Sputtered CdS/CdTe Solar Cells: Effects Of Magnetic Field, RF Power, Target Morphology, And Substrate Temperature," *First WCPEC*, Dec. 5–9, 1994, Hawaii.

Espinoza–Beltran, F. J., Influence Of The Substrate Temperature On The Structure And Surface Roughness Of $Cd_{0.18}Sb_{0.64}Te_{0.18}$ films, *Journal of Materials Science*, 32:3201–3205 (1997).

Fukuda, Mitsuo, "Optical Semiconductor Devices," John Wiley & Sons, Inc. (1999).

Gessert, T. A., Development Of rf Sputtered, Cu–Doped ZnTe for Use as a Contact Interface Layer to p–CdTe, *Journal of Electronic Materials*, vol. 24(10):1443–1449 (1995).

Quirk, Michael and Serda, Julina, Semiconductor Manufacturing Technology, Prentice–Hall, Inc. Upper Saddle River, New Jersey 07458 (2001).

Tomita, Yasuhiro, Carrier Transport Properties of Sputter–Deposited CdS/CdTe Heterojunction, *Jpn. J. Appl. Phys.*, vol. 32:1923–1928 (1993).

Tomita, Yasuhiro, Properties of Sputter Deposited CdS/CdTe Heterojunction Photodiode, *Jpn. J. Appl. Phys.*, vol. 33:3383–3388 (1994).

Tomita, Yasuhiro, X–Ray Imaging Camera Tube Using Highly Sensitive CdTe Photoconductive Film, *SPIE*, vol. 2173:153–160 (1994).

Tomita, Uasuhiro, "X–Ray Imaging Camera Tube Using Sputter–Deposited CdTe/CdS Heterojunction," *IEEE Transactions on Electron Devices*, vol. 33(2):315–319 (1993).

Xiao, Hong, "Introduction to Semiconductor Manufacturing Technology," Prentice–Hall Inc., Upper Saddle River, New Jersey 07458 (2001).

Zapata–Torres, M., "Large Grain Size CdTe Films Grown On Glass Substrates At Low Temperature," *J. Vac. Sci. Techn.*, A 13(6):2994–2996 (Nov./Dec. 1995).

Zelaya, O., "Large Grain Size CdTe Films Grown On Glass Substrates," *J. Appl. Phys.*, 63(2):410–413 (Jan. 15, 1988).

"Solar Engery Online—sputtering," http://wire0.ises.org/wire/glossary.../ceb6530bcd4d7713c125664e00453059!OpenDocumen, Printed May 15, 2001.

"Absorption Coefficient," http://wire0.ises.org/wire/glossary.../d338eda3f810b1a0c125664b004d89e0!Open Documen, Printed May 15, 2001.

"Intrinsic Semiconductor," http://wire0.ises.org/wire/glossary.../e0397d4ef1cec125664e00448402!OpenDocumen, Printed May 15, 2001.

"Band Gap Energy (eg)," http://wire0.ises.org/wire/glossary.../fbe42f37e6d7d7c1c125664c0055e79c!OpenDocumen, Printed May 15, 2001.

"Substrate," http://wire0.ises.org/wire/glossary.../9b4895480f002393c125664e0045353b!OpenDocumen, Printed May 15, 2001.

Superstate, http://wire0.ises.org/wire/glossary.../f481898dfb6ccc569ac125664e00453918!OpenDocumen, Printed May 15, 2001.

"What is Photovoltaics?" http://www.daystartech.com/whatpv.htm, Printed Feb. 20, 2001.

"œSolar Cell Manufacturing Technology," http://www.nedo.go.jp/3color–e/shinene/taiyo–1.html, Printed Feb. 20, 2001.

"NREL Achieves World Record Performance For Thin Film Solar Cell Technology," http://www.nrel.gov/hot–stuff/press/thinfilm.html, Printed Feb. 20, 2001.

"World–Record Solar Cell A Step Closer To Cheap Solar Energy," http://www.nrel.gov/hot–stuff/press/999world.html, Printed Feb. 20, 2001.

"Material And Device Development," http://www.nrel.gov/ncpv/cadmium.html, Printed Feb. 20, 2001.

"Manufacturing and Deployment," http://www.nrel.gov/ncpv/cdteteam.html, Printed Feb. 20, 2001.

"Thin Films: Past, Present, Future," http://www.nrel.gov/ncpv/documents/thinfilm.html, Printed Feb. 20, 2001

* cited by examiner

THIN FILM FLEXIBLE SOLAR CELL

RELATED APPLICATIONS

This application claims the benefit of U.S. provisional application serial No. 60/254,760, filed on Dec. 12, 2000.

FIELD OF THE INVENTION

The present invention relates generally to solar or photovoltaic cells and, more particularly, relates to thin film solar cells deposited onto plastic substrates at low temperatures.

BACKGROUND OF THE INVENTION

The conversion of the sun's electromagnetic energy into electricity occurs in a wide variety of semiconductor materials. Single element semiconductors, such as silicon (Si) and germanium (Ge), as well as some compound materials, such as gallium arsenide (GaAs), cadmium telluride (CdTe) and indium phosphide (InP), are capable of forming junctions that create a built-in electric field in the material. These materials are further capable of absorbing photons of energy sufficient to create electron-hole pairs, thereby creating an electrical current. This phenomenon, which is known as the photovoltaic (PV) effect, is the scientific and theoretical foundation for today's solar energy market.

Electricity produced by solar cells would have a bigger impact were it not so expensive. The cost of the raw materials, equipment, and energy required to manufacture crystalline and polycrystalline solar cells is prohibitive for wide-scale market penetration. Presently, it is cheaper to produce electricity with coal fired or nuclear plants. As much as half the cost of solar cells lies in an expensive substrate such as crystalline silicon. A less expensive substrate is desirable.

The arrangement of cells into solar modules or arrays creates enormous industry-wide manufacturing problems. The cost and complexity of conventional solar panels conspire against the deployment of solar cells in many applications, such as portable electronics and computers. Crystalline thick-film solar cells are also fragile and bulky, which minimizes their acceptability in the marketplace. They are less rugged than conventional materials such as roof tiles. They are expensive to transport because they must be carefully protected from breakage. A flexible solar cell, if available, would be more rugged, less likely to break, and could be rolled up for easy transport or shipping.

Thin-film solar cells have been explored as a solution to this dilemma. Thin-film solar cells are several orders of magnitude thinner than their single-crystal and thick-film polycrystalline counterparts and thin-film processes lend themselves to amorphous construction. An amorphous thin-film cell can be manufactured in a fraction of the time that it takes to monitor and incubate crystal growth. Energy-intensive processes such as chemical treatments and high-temperature annealing are not necessarily required for the manufacture of amorphous materials. All polycrystalline CdTe solar cell manufacturing processes urge heat treatment, either before or after deposition, at temperatures of at least 400 degrees centigrade. Amorphous CdTe is incompatible with such heat treatments.

SUMMARY OF THE INVENTION

The present invention addresses the drawbacks of prior art solar cells noted above and provides a flexible, thin film solar cell.

In one embodiment of the invention, a solar cell comprises a flexible substrate; an n-type window layer deposited onto the substrate at a temperature sufficiently low so as not to damage the substrate; and a p-type absorption layer deposited onto the n-type window layer at a temperature sufficiently low so as not to damage the substrate. In this embodiment, the deposition is preferably carried out at a temperature sufficiently low such that crystallization of the n-type and p-type layers does not occur.

In another embodiment of the invention, a thin film flexible solar cell comprises a plastic or polymer substrate; a thin film of n-type cadmium sulfide deposited onto the substrate at a temperature sufficiently low so as not to damage the substrate; and a comparatively thicker film of p-type cadmium telluride deposited onto the n-type window layer at a temperature sufficiently low so as not to damage the substrate. In this embodiment, the cadmium sulfide and cadmium telluride films have either an amorphous or a polycrystalline structure.

In a further embodiment of the invention, a thin film flexible solar sell comprises a flexible substrate; a current collection layer deposited onto the substrate; an n-type semiconductor film that is deposited onto the current collection layer and has an amorphous atomic structure; a p-type semiconductor film having a bandgap energy less than the n-type semiconductor film that is deposited onto the n-type semiconductor film and has an amorphous atomic structure; and a metallization layer deposited onto the p-type semiconductor film.

In a still further embodiment of the invention, a method for manufacturing a thin film flexible solar cell is provided. It comprises the steps of providing a plastic or polymer substrate; depositing a layer of an n-type semiconductor on the substrate at a temperature sufficiently low to avoid melting or damaging the substrate; and depositing a layer of a p-type semiconductor on the substrate at a temperature sufficiently low to avoid melting or damaging the substrate. In this embodiment, the deposition is preferably carried out at a temperature such that the semiconductor layers have an amorphous or polycrystalline structure

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION OF THE INVENTION

Figure 1:
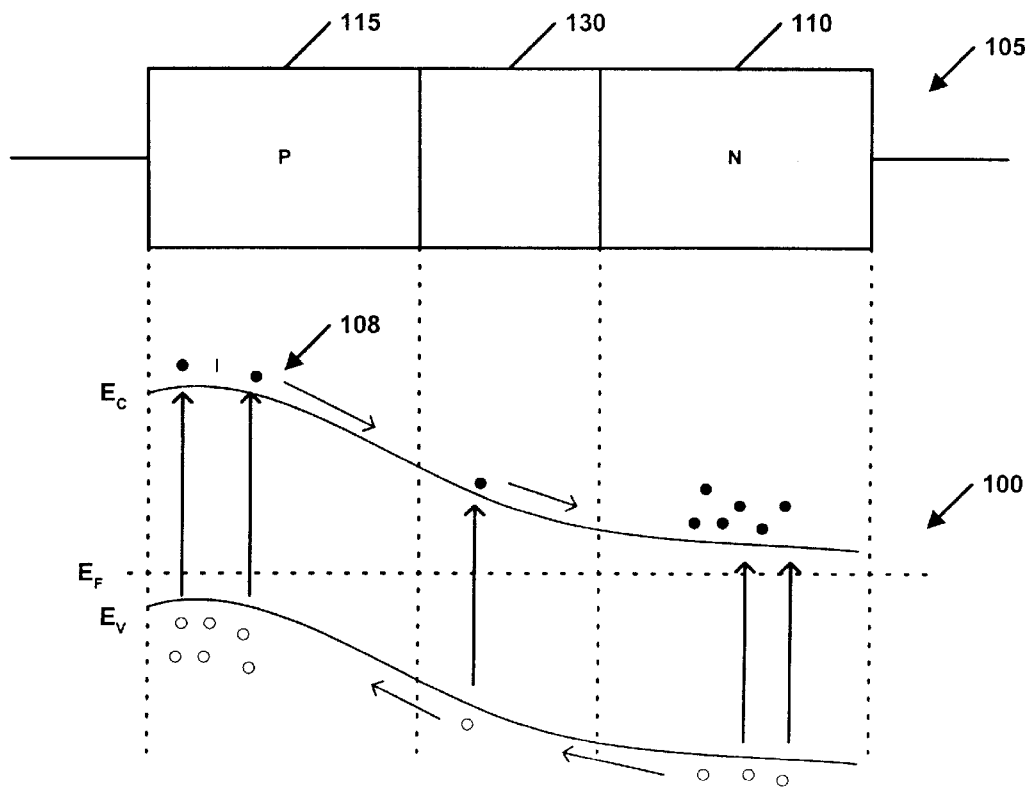
FIG. 1 is an energy band diagram of a typical pn-homojunction solar cell under light incidence.

A homojunction solar cell is a semiconductor pn-junction constructed to absorb a determinable range of wavelengths from the sun's electromagnetic spectra and operable an electrical bias. "Homojunction" means that the same semiconductor material is used for both the n-layer and the p-layer. FIG. 1 is an energy band diagram 100 of a typical pn-homojunction solar cell 105 under light incidence. If the photon energy (hv) of the light incident upon the cell is greater than the semiconductor material's band gap energy, ($E_c$-$E_v$), electron-hole pairs are generated in depletion region 130, n-layer 110 and p-layer 115. While some recombination of carriers occurs, some of the carriers 108 generated drift across the pn-junction depletion region resulting in photocurrent.

Figure 2:
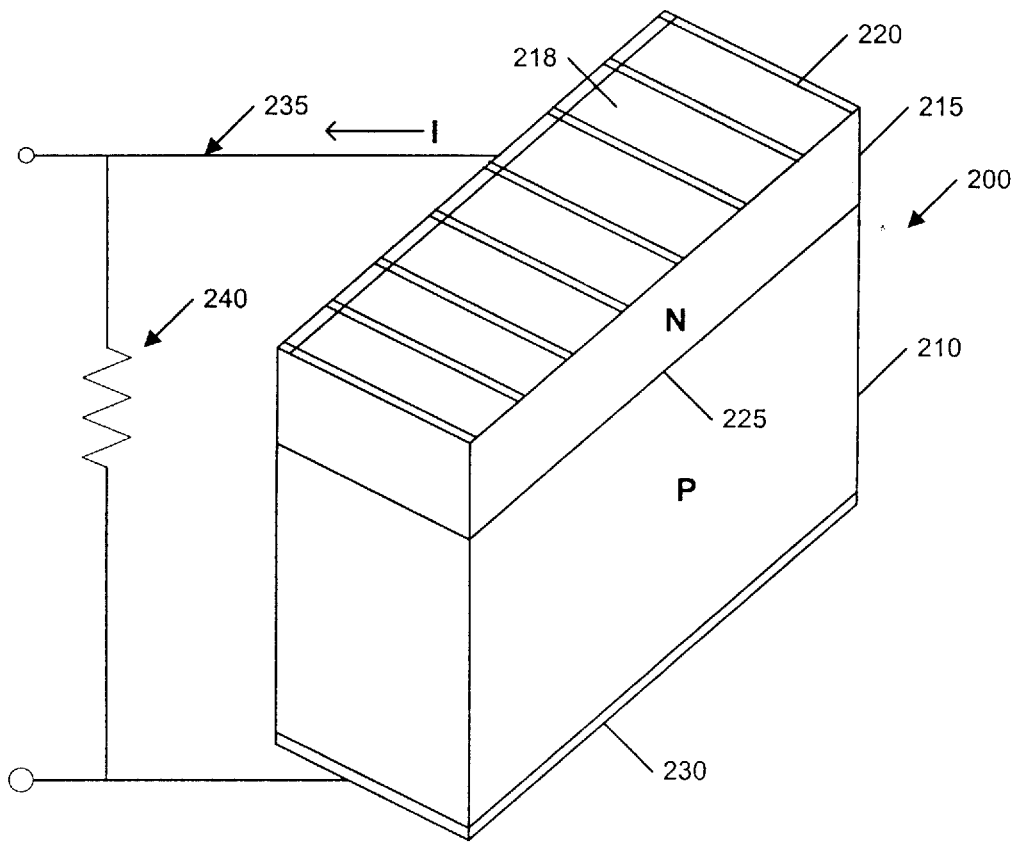
FIG. 2 is a perspective view of a typical pn-homojunction solar cell driving a load.

FIG. 2 is a perspective view of a typical "thick-film" crystalline pn-homojunction solar cell 200 having the energy band diagram shown in FIG. 1. Junction 225 is formed by joining an n-layer 215 and a p-layer 210 made from the same semiconductor material but having different carrier types and concentrations. Solar cell 200 is the product of the same ingot growth and wafer fabrication technology used in the first steps of modern integrated circuit manufacture. Thick crystal p-layer 210 (often millimeters in thickness) provides cell 200 with structural support as well as photon absorption capability. The resulting junction 225 provides an electrical field sufficient to force a photoelectric current I through a current collecting circuit 235.

N-layer 215 is a thin layer and typically comprises an extrinsic donor-doped semiconductor material, such as phosphorous-doped silicon. P-layer 210 is comparatively thicker and typically comprises an extrinsic acceptor-doped semiconductor that exhibits superior absorption in a known range of solar spectra, such as aluminum or boron doped silicon. N-layer 215 is deposited onto p-layer 210 using any of a variety of known pn-junction fabrication techniques, including formation of an alloyed junction, epitaxial growth, and thermal diffusion.

Junction 225 is near cell surface 218 in order to enhance optical absorption and improve conversion efficiency. A light wave of photon energy (hv) incident upon n-layer 215 generates a photocurrent I, as described above. Current collecting circuit 235 is provided for collecting the photocurrent I. Circuit 235 comprises comb-shaped ohmic contact 220 overlaying n-layer 215, load resistance 240 and contact 230 at the bottom of p-layer 210. The comb shape of contact 220 prevents excessive resistive losses as charge carriers moving in the n-type layer 215 travel laterally to reach the top metal-semiconductor contact 220. The n-type window layer is generally too resistive to serve this function. Load resistance 240 is representative of any load that modern solar cells drive—from power plants to consumer electronics.

The typical "thick" crystalline pn-homojunction solar cell, such as cell 200, has several attributes that make it cumbersome and costly to manufacture and implement on a large scale. The first attribute of cell 200 to consider is its crystalline atomic structure. Three atomic structures for semiconductor materials are known: crystalline, polycrystalline, and amorphous. A crystalline structure possesses the highest degree of atomic order. Use of a semiconductor having crystalline structure results in a solar cell with extremely high conversion efficiency because carrier mobility is generally the largest in the crystalline form and there are no grain boundaries to impeed carrier movement. Growing crystal ingots, however, is very expensive and laboratory-intensive. Polycrystalline materials also require high processing temperatures and in addition contain numerous grain boundary discontinuities. Not all substrate materials—particularly not plastics—can withstand the high temperature growing or annealing phases required for crystal or polycrystalline growth. For this reason, glass is commonly used as a substrate for polycrystalline solar cells. Additionally, since growing a crystal only a few microns in thickness is impractical, crystalline structures are realistically practical only for thick film applications.

Several other factors work against the commercial viability of pn-homojunction cell 200. The high doping concentration of n-layer 215, while necessary to reduce the sheet resistance of n-layer 215 for current collection purposes, undesirably increases the optical absorption coefficient of n-layer 215. Consequently, there is an increase in optical absorption when ideally n-layer 215 should pass along all photon energy to p-layer 210 unperturbed. Additionally, cell 200 is constructed to make up for a loss in quantum efficiency that results from growing the crystalline p-layer 210 larger than it would otherwise need to be.

With an eye towards avoiding these disadvantages, the present invention is directed to a thin film solar cell having an amorphous structure. Semiconductors having an amorphous structure, while lacking any recognizable long-range order among atoms, confer several advantages. A comparatively modest output of energy is required during manufacturing due to the relatively low temperatures and relatively thin layers of semiconductor materials employed, and the manufacturing processes employed can be highly automated, thereby reducing the cost of manufacture. Cells having an amorphous structure can be grown to a large surface area while growing single crystals with a large surface area is impractical.

The present invention can utilize a semiconductor having an amorphous or polycrystalline structure, though an amorphous structure is preferred. The demarcation point that sets an amorphous structure apart from a polycrystalline structure is imprecise—atomic order is a matter of degree. Polycrystalline materials are a compromise in the "order" spectrum, both in performance and cost. Polycrystalline silicon has made inroads in the semiconductor industry in areas such as solar cells and MOSFETs. The number and nature of grain boundaries in a sample often delineate the point at which a polycrystal ceases to display any recognizable atomic order and becomes amorphous. As an example, silicon acquires some degree of crystallinity at grain sizes larger than about 100 Å, measureable using a transmission electron microscope (TEM). However, at 100 Å grain size, the proportion of crystalline material is small. Heat, chemical, and other treatments applied during laboratory processes usually promote greater atomic order. Thus, creating a purely amorphous film presents a practical challenge due in large part to modern multi-stage device fabrication approaches, which tend toward greater atomic order.

Thin-film solar cells are much less expensive to manufacture and can be implemented in a wider variety of applications than a cell such as thick film cell 200. The thickness of a thin-film solar cell is on the order of a few microns, whereas the thickness of a conventional crystalline cell is on the order of a few hundreds of microns. A low-cost substrate material (i.e., glass, foil, or plastic) can be employed rather than a bulky and expensive crystal substrate to provide structural support for the cell.

Emergent thin-film solar cell technology has, over the last two decades, cured some, but not all, of these disadvantages. Thin-film solar cells, while to date not as power efficient, are much less expensive to manufacture and are feasible to implement in a wider variety of applications in which the conventional solar cell of FIG. 2 would fail. First, the thickness of a thin-film solar cell is on the order of a few microns, whereas conventional crystalline or polycrystalline cells are at best a few hundreds of microns thick. Second, a low-cost substrate material (i.e., glass, foil, or plastic) supplants the bulky crystal substrate to provide the structural support for the cell.

The substrate material is critical to a thin film cell whose thin layers require structural support. Throughout this description, reference will be made to a substrate on which a thin-film solar cell is made. Aside from direct reference to the superstrate or substrate configurations of FIGS. 3 and 4, the term substrate as used herein and in the title refers collectively to a substrate or a superstrate on which a solar cell is affixed. In other words, the particular design of a cell is irrespective of the notion that all cells have a substrate that provides the structural support for the cell.

Figure 3:
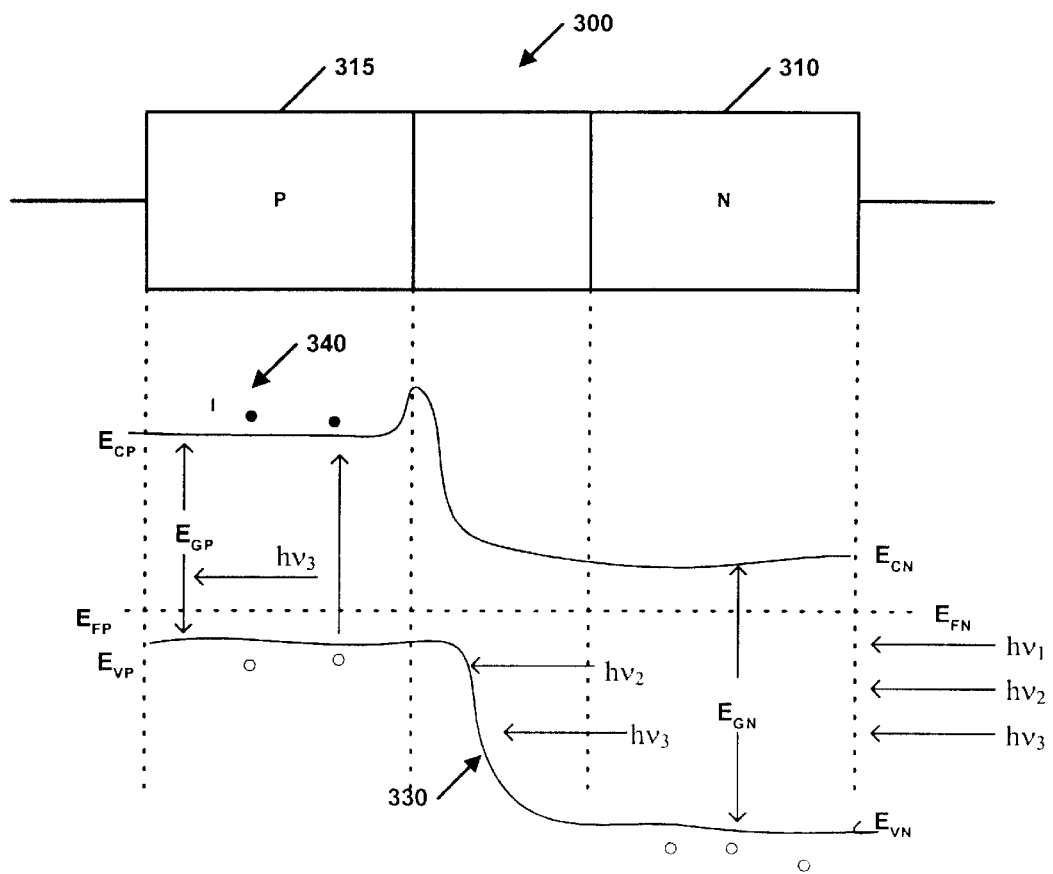
FIG. 3 is an energy band diagram of a typical pn-heterojunction solar cell under light incidence.

FIG. 3 is an energy band diagram of a thin-film pn-heterojunction solar cell useful for demonstrating the advantages of a heterojunction structure over a homojunction structure such as that of cell 200. "Heterojunction" refers to the fact that the n-layer and the p-layer are made from different semiconductor materials. Heterojunction 300 is formed by joining an n-layer 310 and a p-layer 315 made from the different semiconductor materials.

In particular, FIG. 3 illustrates what happens when an n-type semiconductor region 310 of bandgap energy $E_{gn}$ is deposited next to a p-type semiconductor region 315 whose bandgap energy $E_{gp}$ is smaller than $E_{gn}$. The interplay between n-type window layer 310 and p-type absorption layer 315 is observed by considering each layer's behavior when illuminated by light of discrete wavelength components. Light of wavelength $\lambda_1$, incident upon n-type window layer 310 and having a substantially high energy, $hv_1$, which energy is larger than the bandgap, $E_{gn}$, of n-type window layer 310 is completely absorbed by n-type window layer 310. Light of wavelength, $\lambda_2$, incident upon n-type window layer 310 and having a substantially lower energy, $hv_2$, which energy is greater than $E_{gp}$, but less than $E_{gn}$, is completely absorbed by p-type window layer 315. Finally, light of wavelength, $\lambda_3$, incident upon n-type window layer 310 and having an energy lower than both bandgap energy $E_{gn}$ and bandgap energy $E_{gp}$, will pass unabsorbed through all of the semiconductor layers. So long as $E_{gn}$ is sufficiently larger than $E_{gp}$, light intended for absorbtion in the depletion region of the p-type layer will not be attenuated or partially absorbed by the n-type window layer. In contrast, a homojunction cell cannot avoid some loss of efficiency due to light absorbtion in the n-type window layer because both n-type and p-type layers have the same bandgap and thus the same optical absorbtion characteristics.

The superior ability of large bandgap window layer 310 to selectively pass predefined wavelengths of light does not come without its drawbacks. FIG. 3 additionally shows the undesirable effect of excessive band bending caused by the joinder of two distinct semiconductor materials each of different bandgap energies. Conduction band notch 320 at the edge of depletion region 330 represents the chief disadvantage to the pn-heterojunction. It acts as a potential barrier to photo-induced minority carriers 340 and serves to counteract some of the advantages of having large bandgap n-type layer 310 at the pn-heterojunction.

Figure 4:
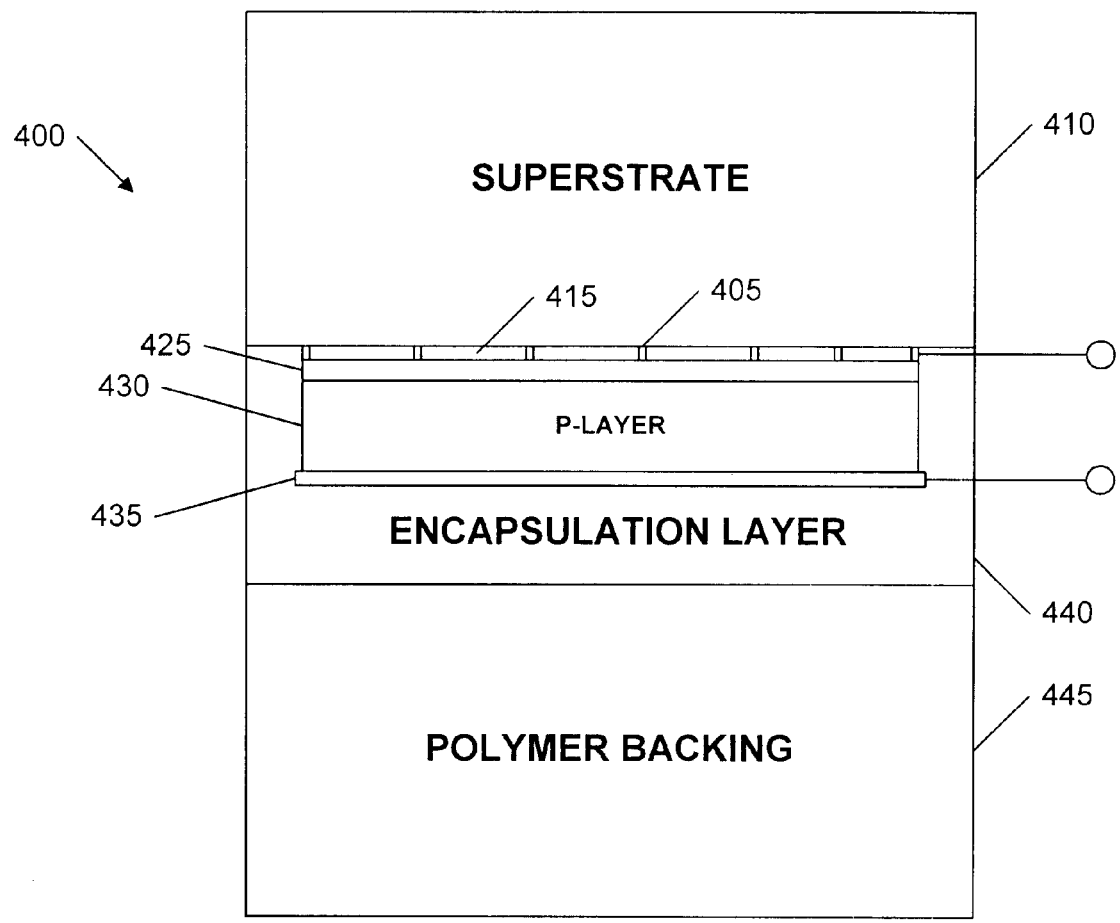
FIG. 4 is a cross-sectional view of a thin-film solar cell deposited at low temperature onto a plastic superstrate, according to the present invention.

FIG. 4 is a schematic cross-sectional view of a first embodiment of an amorphous thin-film pn-heterojunction solar cell 400, such as whose energy band diagram was described with reference to FIG. 3. Solar cell 400 is a multi-layer semiconductor pn-heterojunction fabricated in a "superstrate" configuration, that is, cell 400 is constructed by depositing various films and layers on the supporting superstrate which also acts as the input window for the light. Cell 400 comprises superstrate layer 410, bus bar network 405, transparent conductive oxide (TCO) layer 425, window (n) layer 425, absorption (p) layer 430, back contact layer 435, encapsulation layer 440 and polymer backing 445.

Light enters cell 400 via n-layer 425 after first passing through superstrate layer 410, bus bar network 405 and transparent conductive oxide (TCO) layer 415. The superstrate layer is the covering on the sun side of cell 400 and provides protection for the components of cell 400 from impact and the elements while allowing maximum transmission of light. In one embodiment, layer 410 comprises a transparent, substantially flexible plastic or polymer such as tefzel. Preferably, superstrate layer 410 has a thickness on the order of 5 mils and provides the support structure for cell 400.

TCO layer 415 is deposited onto superstrate layer 410 and functions as a current collection mechanism for current generated by light entering cell 400. TCO layer 415 is necessary because the conductivity of n-type window layer 425 is insufficient to collect the current generated by cell 400. In other embodiments, TCO layer 415 may not be needed, or may comprise a different but similarly functional material.

In one embodiment, TCO layer 415 is indium-tin-oxide (ITO) and is sputter-deposited onto layer 410. Sputtering is a deposition process in which a source material is bombarded by high-energy ions, causing the source material to eject atoms that are then deposited in thin layers on the substrate. The temperature at which the deposition is carried out must be kept sufficiently low to avoid damaging the plastic or polymer superstrate layer 410. In one embodiment, the deposition is carried out at room temperature. In another embodiment, the deposition is carried out at or below the temperature above which a thin film of amorphous cadmium telluride (p-layer 430) crystallizes, so long as this temperature does not melt or damage layer 410. Amorphous CdTe thin films deposited on glass rapidly crystallize at temperatures above 157° C. Below this temperature, amorphous CdTe thin films have proven stable.

TCO layer is an extremely thin layer, having a thickness typically less than one micron. Although methods such as atomic force microscopy may be used to obtain a measurement of the layer thickness, a better metric for characterizing the very thin TCO layer 415 is sheet resistance. Since sheet resistance causes electrical losses in the cell, TCO layer 415 should have a sheet resistance as low as possible. Low temperature deposition of ITO on a plastic substrate yields a sheet resistance of approximately 200 ohms-per-square. Making TCO layer 415 thicker will further reduce sheet resistance. Other ways to reduce sheet resistance include using ion-beam-assisted deposition (IAD) or laser assisted magnetron sputtering. IAD causes atoms freshly deposited on a substrate to move around as if they were indeed "hotter" and produces higher quality films at lower substrate temperatures. Laser-assisted magnetron-sputtering uses a pulsed laser beam to anneal the depositing film without causing the substrate to overheat. In effect, laser assisted magnetron sputtering deposits cell material while simultaneously annealing it. Laser assisted magnetron sputtering can be used to enhance the performance of other layers of cell 400 as well.

A network 405 of metal bus bars is sputter deposited onto TCO layer 415 to assist in collection of the photo-induced current. Network 405 shortens the distance charge carriers must move in the TCO layer in order to reach the metal contact, thereby reducing resistive losses. The resistive losses should be a small fraction of the cell output. The metal bus bars can be made of any reasonably conductive metal. In one embodiment, silver (Ag) is used. The metal bars are preferably configured in a comb-like arrangement normal to the cross-sectional plane of FIG. 4 to permit light rays to pass through TCO layer 415, where a metallization film would otherwise block passage of light.

The temperature at which deposition of bus bar network 405 is carried out must be kept sufficiently low to avoid damaging the plastic or polymer superstrate layer 410. In one embodiment, the deposition is carried out at room temperature. In another embodiment, the deposition is carried out at or below the temperature above which a thin film of amorphous cadmium telluride (p-layer 430) crystallizes, so long as this temperature does not melt or damage layer 410. Experimentation has shown the temperature at which cadmium telluride crystallizes to be approximately 157 degrees centigrade.

Bus bar network layer 405 and TCO layer 415, combined, act as a single metallurgical unit, functionally interfacing with a first ohmic contact to form a current collection circuit. In one embodiment a combined silver (Ag) bus bar network 405 and indium-tin-oxide (ITO) layer 415 function as a single, transparent ITO/Ag layer upon which subsequent semiconductor layers are formed.

The following mathematical approximation, derivable from Ohm's law, is useful in obtaining the theoretical maximum bus bar separation, $L_{cm}$, in centimeters:

$$L_{cm} \leq 2\sqrt{\frac{V_{drop}}{J_{sc} \cdot R_{sq}}},$$

where $R_{sq}$ represents the sheet resistance of TCO layer 415 and $J_{sc}$ represents the short circuit current density of solar cell 400.

Bus bar separation is a function of the sheet resistance, $R_{sq}$, of TCO layer 415 and the maximum acceptable voltage drop, $V_{drop}$, experienced by a charge carrier in traveling from within TCO layer 415 to the bus bar ohmic contact. As a workable design constraint, limiting this maximum acceptable voltage drop to 5 percent of the cell's open-circuit voltage is realistic given the low (yet non-zero) resistivity of even the best conductors known.

For a high efficiency cadmium telluride (CdTe) cell having a short circuit current density, $J_{sc}$, of roughly 24.7 mA/cm and an open circuit voltage of about 0.85 volts, application of these design criteria to the formula above yields a maximum bus bar separation of 0.19 cm. In other words, at a bus bar separation of 0.19 cm or less, the voltage drop a carrier experiences in traveling from the ohmic contact at the n-type layer to the metallization layer is negligible. However, because photocurrent density is proportional to solar cell efficiency, it follows that a less efficient cell equates to a larger allowable bus bar distance, $L_{cm}$. Furthermore, for $R_{sq}$ sufficiently small that bus bar separation $L_{cm}$ is larger than the width of cell 400, the need for bus bar network 405 vanishes.

Window layer 425 is a thinly deposited film of n-type semiconductor material, which when combined with p-type absorption layer 430 forms a pn-junction. To achieve high efficiency, window layer 425 should be as thin as possible because even a thin window layer absorbs some light if the bandgap is not sufficiently large. A pure window layer that passes all photon energy on to p-type layer 435 does not exist, despite efforts in the scientific community to discover one. A thin window layer 425 is achievable, for example, using IAD or the laser assisted magnetron sputtering technique previously described with reference to TCO layer 415.

Crystalline silicon has been the semiconductor of choice in the photovoltaic market for over four decades due to its widespread prevalence in the solid state electronics and computer markets. In view of its low optical absorption coefficient and low band gap energy, however, crystalline silicon is not ideally suited for serious solar power generation. The semiconductor should be a direct band gap or otherwise have large optical absorption coefficients at the important optical wavelengths. The semiconductor should have an energy band gap, $E_g$, at or very near the energy level of the earth's solar spectrum (a range of 1–1.8 eV is ideal). Finally, because light must reach the depletion region of the cell's pn junction, a thin, minimally absorbent semiconductor having a wide bandgap is advantageous for the window layer.

Cadmium telluride (CdTe) is a p-type semiconductor possessing the necessary attributes, and cadmium sulfide (CdS) has been found to work optimally as the n-type window layer. Other semiconductor materials gracing the solar cell stage include germanium (Ge) and the III-V compounds, gallium arsenide (GaAs) and indium phosphide (InP). However, cadmium telluride, a II-VI compound, is superior for photovoltaic use due to its optimum band gap energy ($\approx$1.5 eV) and a correspondingly high coefficient of optical absorption ($>10^5$ cm$^{-1}$ for visible light) that makes it an efficient absorber of solar spectra. The naturally n-type II-VI compound, cadmium sulfide (CdS), forms a very good heterojunction with CdTe. CdS, as the window layer to CdTe in a solar cell pn-heterojunction, has the requisite high bandgap ($\approx$2.4 eV) to minimize solar energy absorption and pass light on to the absorber layer.

Accordingly, in one embodiment of the present invention, window layer 425 is a thin cadmium sulfide (CdS) film having a thickness in the range of 1,000–20,000 angstroms that is sputter deposited onto the combined ITO/Ag network layer. The temperature at which deposition of window layer 425 is carried out must be kept sufficiently low to avoid damaging the plastic or polymer superstrate layer 410. In one embodiment, the deposition is carried out at or below the temperature above which a thin film of amorphous cadmium telluride (p-layer 430) crystallizes, so long as this temperature does not melt or damage layer 410. Experimentation has shown the temperature at which cadmium telluride crystallizes to be approximately 157 degrees centigrade. Though an amorphous layer is preferred, the deposition could also be carried out at temperatures that produce a polycrystalline layer so long as the temperatures are not so high as to damage plastic layer 410.

Window layer 425 should not be so thin as to cause pinholes to develop. Pinholes are fabrication defects causing non-neighboring layers to make contact in places where the intervening deposited layer or layers do not afford complete coverage. Pinholes significantly decrease cell efficiency and dictate against excessively thin layering as a process—i.e., window layer thicknesses below 2000 angstroms risk incomplete coverage. Hence, in one embodiment window layer 425 has a thickness in the range of 2,000–20,000 angstroms, with a preference toward 2,000 angstroms if attainable without pinholes.

Absorption layer 430 is a thin film of p-type semiconductor material deposited onto window layer 425. It preferably has a thickness in the range of 0.2–10 microns, and most preferably 0.3–2 microns. In one embodiment, absorption layer 430 is a thin, sputter-deposited cadmium telluride (CdTe) film having a thickness of approximately 1 micron. The temperature at which deposition of CdTe layer 430 is carried out must be kept sufficiently low to avoid damaging the plastic or polymer superstrate layer 410 and to avoid crystallization of the CdTe. In one embodiment, the deposition is carried out at or below the temperature above which a thin film of amorphous cadmium telluride (p-layer 430) crystallizes, so long as this temperature does not melt or damage layer 410. Experimentation has shown the temperature at which cadmium telluride crystallizes to be approximately 157 degrees centigrade. Again, though amorphous CdTe is preferred, the deposition can be carried out at temperatures that produce polycrystalline CdTe so long as the plastic layers are not melted or damaged in the process.

In setting the thickness of absorption layer 430, there are several factors to consider. High cell efficiency and a layer thick enough to substantially absorb all of the incoming light go hand in hand. The resultant large carrier diffusion lengths of a thick layer, however, tend to counteract the corresponding increase in current density across the junction. Overcompensating for this effect with a thin absorption layer can create pinholes. The absorption layer must also be thick enough (and pinhole-free enough) to substantially block migration of atoms from back contact layer 435 to window layer 425.

Absorption layer thickness influences the percentage of incoming light absorbed by the layer. The coefficient of optical absorption, $\alpha_{ab}$, is the factor by which photons are absorbed as they travel a unit distance through a material. The coefficient of optical absorption varies as a function of the wavelength of light. In general, a thicker layer will exhibit greater absorbency and correspondingly greater conversion efficiency.

Studies have demonstrated that the absorption coefficient for crystalline CdTe ranges from $10^5$ cm$^{-1}$ to $10^4$ cm$^{-1}$ over the visible and deep red portions of the electromagnetic spectrum. According to principle, while holding wavelength constant in the deep red portion of the spectrum, a three micron layer of crystalline CdTe was shown to absorb about 95 percent of the incident light, and a five micron layer absorbed over 99 percent of the light. A thinner layer, however, may meet absorption and efficiency standards for select wavelengths but not for others. For example, a 0.5 micron absorption layer absorbed 40 percent of deep red light and nearly 99 percent of blue light. The use of sputter-deposited amorphous films is also a factor, as such films typically possess different absorption coefficients than their crystalline and polycrystalline counterparts. In light of the foregoing concerns, the inventors have found that an ideal thickness for p-type absorption layer 430 is in the range of 0.2 to 10 microns. In one embodiment, a laser assisted magnetron is used to sputter deposit thin film absorption layer 430 to achieve the desired thickness. In another embodiment, IAD is used to sputter deposit thin film absorption layer 430 to achieve the desired thickness.

In thin-film pn-heterojunction solar cell 400, the n-type semiconductor material will likely have a different point of crystallization from that of the p-type semiconductor material. Hence, in one embodiment p-type absorption layer 430 is amorphous while n-type window layer 425 is polycrystalline. For example, p-type absorption layer 430 may be amorphous CdTe and n-type window layer 425 may be polycrystalline CdS.

Back contact layer 435 is a metallization layer deposited on top of absorption layer 430. It forms a second electrode to complete the current collection circuit (along with the first electrode formed by bar network 405 and TCO layer 415). In one embodiment, back contact layer 435 is a thin, sputter-deposited film of copper 0.2–1.0 microns thick, although some other conductive metals (e.g., silver and gold) are acceptable substitutes. The temperature at which deposition of contact layer 435 is carried out must be kept sufficiently low to avoid damaging the plastic or polymer superstrate layer 410, and sufficiently low to prevent crystallization of CdTe layer 430. In one embodiment, the deposition is carried out at or slightly above room temperature. In another embodiment, the deposition is carried out at or below the temperature above which a thin film of amorphous cadmium telluride (p-layer 430) crystallizes, so long as this temperature does not melt or damage layer 410.

Because metals like copper, silver and gold can be costly, the thickness of back contact layer 435 is partially driven by a desire to minimize the amount of metal used. Practical and physical constraints, however, set the lower thickness boundaries for back contact layer 435. First, the surface area of cell 400 defines the lower limit of back contact thickness because the necessary sheet resistance is proportional to cell size. The inverse relationship between cell size and sheet resistance developed in reference to TCO layer 415 above is usable here (in reverse direction) to determine the sheet resistance given a cell size. For instance, using this formula, a one square centimeter cell requires a sheet resistance of roughly seven ohms-per-square. Then, by using the known equation, $$R = \rho \frac{1}{A}$$

which relates a material's resistivity to a sample's resistance, one determines the necessary thickness of back layer 435 to require roughly 25 Å of deposited copper (the resistivity of Cu is $1.7 \times 10^{-8}$ Ω·m). However, the resistivity of sputter deposited copper is higher than the bulk value given above. Also, to insure complete coverage, at least 1000 Å to 2000 Å thickness is required as a rule of thumb. Hence the back contact layer thickness is at least 2000 Å. The sheet resistance of the deposited metal layer should be measured to insure that it is adequately low.

As cell size increases, as likely it would for commercial cells, the sheet resistance must be decreased. For example, a 5 cm square cell would require a sheet resistance of 0.28 ohms-per-square, which translates to roughly 625 Å of deposited copper with the bulk value of resistivity. Once again, a minimum thickness of 2000 Å is required to insure complete coverage. One effective way to control the sheet resistance of back contact layer 435 is to use a laser assisted magnetron to aid the sputtering process. Another effective way to control the sheet resistance of back contact layer 435 is to use ion assisted deposition (IAD) to aid the sputtering process.

Back contact layer 435 must uniformly cover the surface of the cell. For many applications a minimum thickness of the order of 2000 Å is required. The pinhole shorting effect is not at issue here because back contact layer 435 is an end-layer. Nevertheless, for efficient current collection purposes, gaps in cell coverage are not desirable. Of greater concern is cell degradation caused by diffusion of metal atoms into window layer 425 along grain boundaries in absorption layer 430. Without a barrier, copper would readily diffuse through crystalline CdTe into the CdS window layer along grain boundaries. Advantageously, amorphous materials such as amorphous CdTe form a natural barrier to metal diffusion as they have few if any grain boundaries. Copper advantageously acts as a shallow acceptor in CdTe creating a heavily doped p+ metal-semiconductor layer at the point of ohmic contact between absorption layer 430 and back contact layer 435. Other metals which may work because they form shallow acceptors in CdTe include silver and gold. As a final consideration for choice of back contact 435, a reflective metal can be selected to overcome potentially poor absorption qualities of absorption layer 430 if, for instance, absorption layer 430 was made thin to overcome carrier transport limitations. A reflective back contact 435 would allow light to reflect back through absorption layer 430 and have a second chance at getting absorbed by absorption layer 430.

For commercial deployment, solar cell 400 should be protected from environmental exposure. Some of the materials used in cell 400, such as CdTe, are moisture sensitive. Encapsulation layer 440 overlays cell 400 to provide an air-tight and water-tight protective barrier against moisture and contaminants. Encapsulation layer 440 consists of a polymer material such as ethyl vinyl acetate (EVA). A comparatively thick layer 445 of a rugged plastic or polymer underlays encapsulation layer 440 to form a back polymer layer to hermetically seal and ready cell 400 for commercial use. Layer 445 may be an optically opaque polymer but should be impermeable to air and water. Tefzel may also be used for the back polymer layer. A low temperature heat treatment bonds encapsulation layer 440 to back polymer layer 445.

Figure 8:
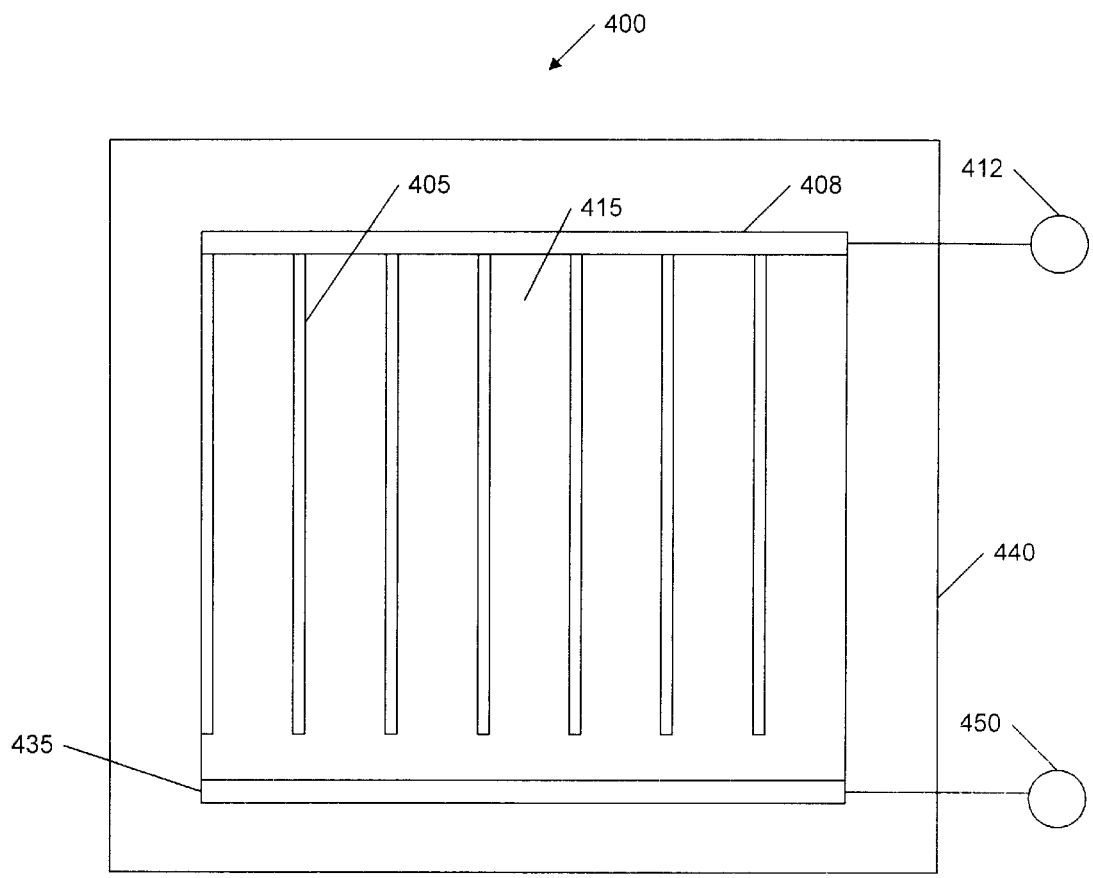
FIG. 8 is a top view of the solar cell of FIG. 4, according to the present invention.

FIG. 8 is a top view of cell 400. The top plan view of substrate configuration cell 500, to be described below with reference to FIG. 5, would be substantially similar. Superstrate 410 is transparent and hence is not seen in FIG. 8. The outer rectangle is the encapsulation layer 440 or, if layer 440 is transparent, substrate 445. In any event, layer 440 represents the relative dimensions of the substrate or superstrate on which solar cell 800 is affixed as compared with the internal semiconductor and metallization layers sandwiched therein. Bus bar network 405 and TCO layer 415 overlay n-type window layer 425 (not shown) and, below that, p-type absorption layer 430 (not shown). The comb-shaped bars of network 405 aggregate in master current collection bar 408 from which electrical contact 412 extends. The bars of network 405 should extend across and evenly cover the expanse of n-type layer 425. Back contact layer 435 is deposited underneath p-layer 430 and extends slightly beyond the footprint of ITO layer 415 and network 405. Electrical contact 450 extends from layer 435, and the load to be driven by cell 400 may be connected between contact 412 and contact 450. Electrical isolation must of course be maintained between the front and back contacts.

Figure 5:
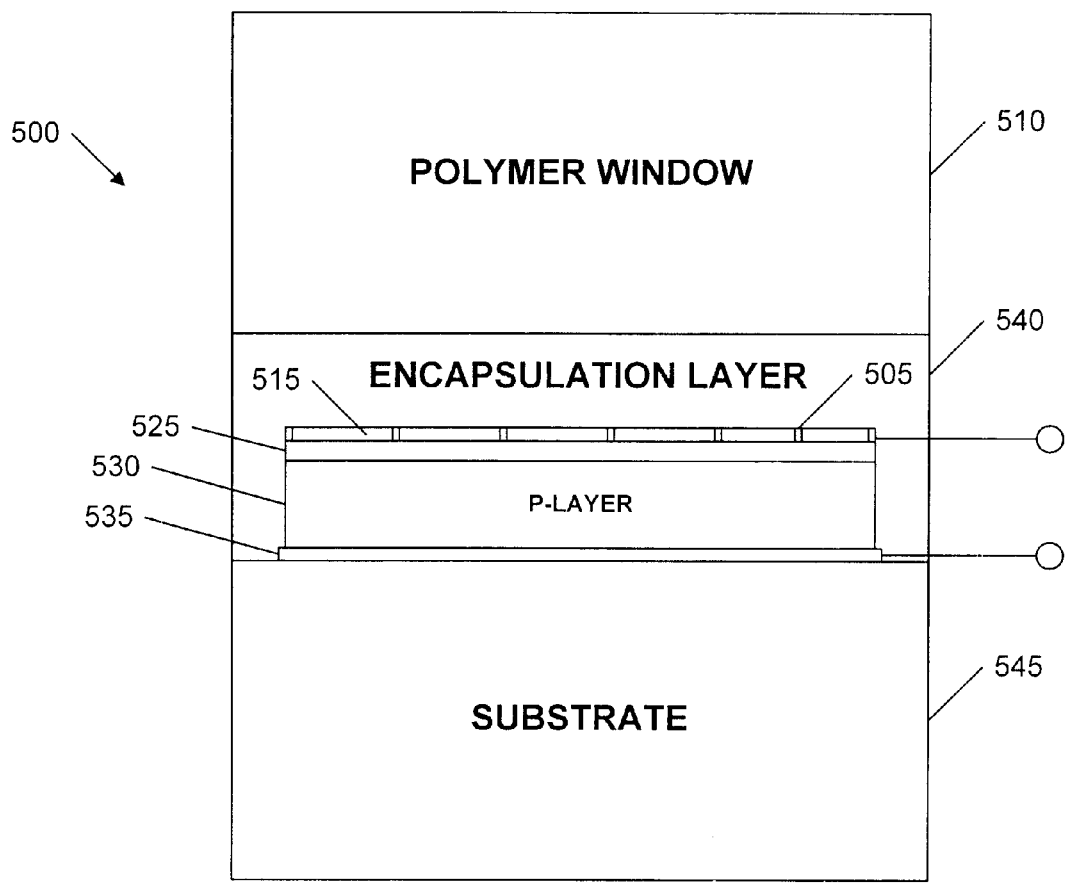
FIG. 5 is a cross-sectional view of a thin-film solar cell deposited at low temperature onto a plastic substrate, according to the present invention.

FIG. 5 is a schematic cross-sectional view of an alternate embodiment of an amorphous thin-film pn-heterojunction solar cell 500. Cell 500 is a multi-layer cell fabricated in a substrate configuration. In this configuration, the layers are deposited on a substrate 545, rather than on a superstrate. Substrate 545 need not be transparent; light energy unabsorbed by the p-layer will exit the substrate layer. In one embodiment, substrate layer 545 is made of a substantially flexible plastic material such as tefzel having thickness on the order of 5 mils and providing the support structure for the cell.

Back contact layer 535 is a metallization layer deposited on top of substrate layer 545 and forming a first electrode to complete a current collection circuit (not shown). In one embodiment, back contact layer 535 is a thin, sputter-deposited film of copper 0.9 micrometers in thickness. As with cell 400, the temperature at which deposition of layer 535 is carried out must be kept sufficiently low to avoid damaging the plastic or polymer layer 545. Computation of optimal back contact layer 535 thickness follows the same analysis previously propounded for back contact layer 435. Additionally, a reflective back contact layer 535 may be selected to overcome poor semiconductor layer absorption as previously explained.

Absorption layer 530 consists of a thin film of p-type semiconductor material deposited onto back contact layer 535. In one embodiment, absorption layer 530 consists of a thin, sputter-deposited CdTe film having a thickness on the order of 0.3 microns. The temperature at which deposition of CdTe layer 530 is carried out must be kept sufficiently low to avoid damaging layer 545 and to avoid crystallization of the CdTe.

Window layer 525 consists of a thinly deposited film of n-type semiconductor material, which (when combined with absorption layer 530) forms a pn-heterojunction. In one embodiment, window layer 525 consists of a thin, sputter-deposited CdS film having a thickness on the order of two microns. Again, the temperature at which deposition of layer 525 is carried out must be sufficiently low to avoid damaging layer 545 and to avoid crystallization of CdTe layer 530.

Transparent conductive oxide (TCO) layer 515 is deposited onto window layer 525 and provides a collection means for the photo-induced current generated in the pn-junction of cell 500. In one embodiment, TCO layer 515 is indium-tin-oxide (ITO), sputter-deposited onto window layer 525 and having a sheet resistance on the order of 200 Ohms per square. The temperature at which deposition of layer 515 is carried out must be sufficiently low to avoid damaging layer 545 and to avoid crystallization of CdTe layer 530.

A thinly deposited network of bus bars 505 overlays TCO layer 515 to provide a means for improved collection of the photo-induced current. In one embodiment, bus bar network 505 has a comb-like arrangement of tines substantially covering TCO layer 515 and being normal to the cross-sectional plane of FIG. 5. As well, a comb-like structure permits light rays to pass through the TCO layer, where a metallization film would otherwise block the passage of light. Bus bar network layer 505 can be, for example, silver (Ag) or other conductive metal made to form a solid contact with TCO layer 515. Network 505 is sputter deposited onto TCO layer 515 at a temperature sufficiently low to avoid damaging layer 545 and to avoid crystallization of CdTe layer 530.

Encapsulation layer 540 overlays cell 500 to provide an air-tight protective barrier against moisture and contaminants. Encapsulation layer 540 is preferably a polymer material such as ethyl vinyl acetate. A comparatively thick layer 510 of a rugged, transparent plastic (i.e., tefzel) overlays encapsulate layer 540 to form the top polymer window, which readies cell 500 for commercial use. A combination of pressure and low temperature heat treatment bonds encapsulate layer 540 to plastic layer 510.

In off-grid commercial applications where environmental threats are low, the superstrate and substrate layers may be cheaper, less rugged materials. The chemical breakdown of the solar cell from the sun's rays is an obvious concern; and any protective layer applied to the cells should be engineered accordingly. Of bigger concern is the robustness of the outer layers in extreme conditions such as prolonged outdoor exposure to ice. A CdTe solar cell on a plastic substrate installed on a portable electronic device such as a mobile telephone, for example, will likely be exposed to full sunlight for prolonged periods; but will likely not be exposed to harsh winter elements of snow and ice for prolonged periods. Thus, in one embodiment, the superstrate and substrate layers may be Melonex or another long-lasting, less expensive polyester material. Both transparent and translucent varieties of Melonex exist as substitutes for tefzel.

The encapsulation layer may be made from an alternate material as well. In one embodiment, the encapsulation layer is a VHB (very high bonding) adhesive which is designed to adhere strongly to Melonex. Advantageously, the combination of Melonex with VHB adhesive does not require pressurized heat treatment.

Figure 6:
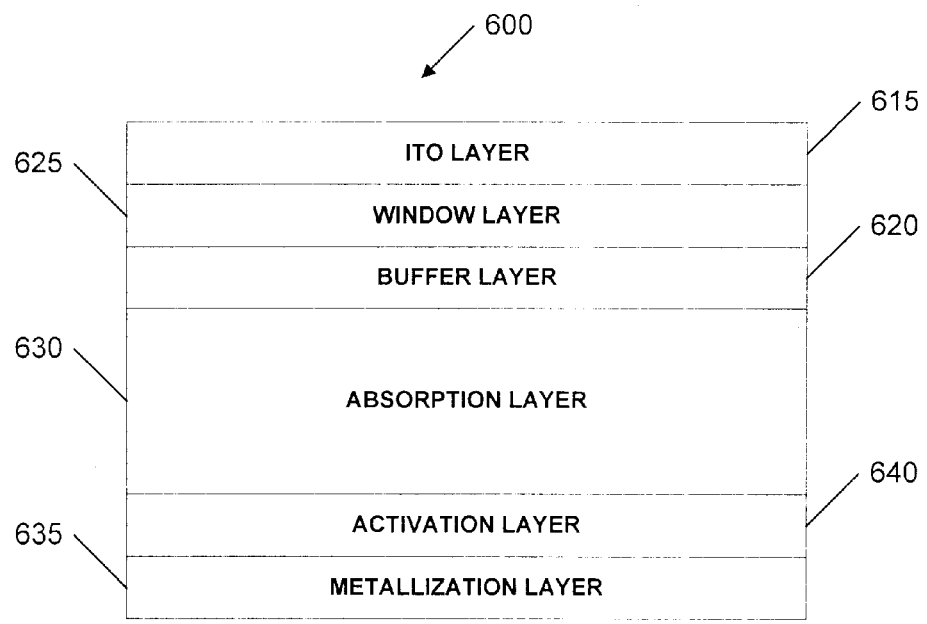
FIG. 6 is a cross-sectional view of a thin-film pin-heterojunction solar cell, according to the present invention.

FIG. 6 illustrates another embodiment of the present invention comprising a thin-film heterojunction solar cell 600. Cell 600 may be constructed in either a superstrate or substrate configuration, as described above, including the use of low temperature sputter deposition for all layers. The heterojunction structure of FIG. 6 differs from the pn-heterojunction by the inclusion of a blended semiconductor layer 620 between n-type window layer 625 and p-type absorption layer 630. In one embodiment, the semiconductor materials that comprise layers 625 and 630 are co-deposited to a predetermined thickness to form the buffer layer 620. In one embodiment, layer 620 is 0.02 to 1 microns thick and comprises a blend of 50% CdTe and 50% CdS. As in the previously described embodiments, cell 600 comprises ITO layer 615 and metallization layer 635. An activation layer 640 is optionally deposited between p-layer 630 and metallization layer 635. In one embodiment, activation layer 640 comprises cadmium chloride (CdCl).

Figure 7:
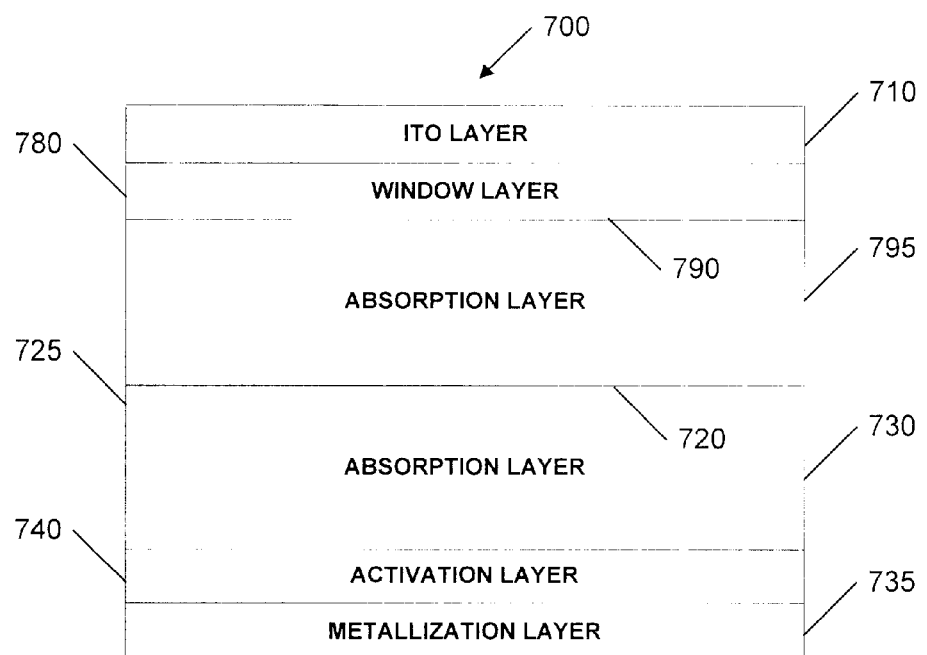
FIG. 7 is a cross-sectional view of a thin-film dual pin-heterojunction solar cell, according to the present invention.

FIG. 7 is a still further embodiment of the present invention comprising a thin-film dual-junction solar cell. Cell 700 may be constructed in either a superstrate or a substrate configuration, as described above. Cell 700 consists essentially of a first junction 720 overlayed onto a second pn-heterojunction 790. First junction 720 is formed between p-type absorption layer 730 and p-type absorption layer 795 while second junction 790 is a pn-heterojunction formed between n-type window layer 780 and p-type absorption layer 795. One way to build dual-junction cell 700 is to first sputter deposit p-type absorption layer 730 at a low temperature onto back contact metallization layer 735. Next p-type absorption layer 730 is sputter deposited at low temperature onto back contact layer 735. Deposited thereon is second p-type absorption layer 795, which forms a first junction 720 with layer 730. Deposited thereon is thin n-type window layer 780, completing pn-heterojunction 790 with layer 795. TCO layer 710 is deposited on layer 780 followed by a bus bar network to complete a current collection circuit with back contact layer 735. An activation layer 740 is optionally included.

Solar cell 700 achieves greater efficiency because absorption layer 730 has a smaller bandgap energy than absorption layer 795. First to intercept the light rays incident upon cell 700, absorption layer 795 with the larger bandgap energy will absorb more light from the blue end of the solar spectrum. Absorber layer 730, having a smaller bandgap than absorption layer 795, will absorb light in the red end of the spectrum. Thus, greater energy efficiency is possible using this cell configuration because low energy photons that do not get absorbed by absorption layer 795 will be absorbed by absorption layer 730, rather than escaping the cell unabsorbed had there been only a single high bandgap layer. Additionally, greater efficiency is achieved when high energy photons are absorbed in absorption layer 790 because some photon energy would be wasted as heat if only one absorption layer of low bandgap energy were available in the cell.

Dual-junction cell 700 requires two absorption layers of differing bandgaps with the layer possessing the higher bandgap forming junction 790 with window layer 780. Amorphous and crystalline forms of a given material are known to have different bandgaps. Thus, in one embodiment absorption layer 795 is amorphous CdTe and absorption layer 730 is polycrystalline CdTe, because amorphous CdTe has higher bandgap energy than crystalline CdTe. In such an embodiment, the substrate configuration discussed at length above with reference to FIG. 5 is preferable because deposition of crystalline absorption layer 730 should come before the deposition of amorphous absorption layer 795 so that amorphous layer 795 does not crystallize by further processing steps.

A dual-junction solar cell is also desirable for overcoming situations where absorption layer 430, 530 must be made so thin to cure carrier transport problems that the layer no longer is able to adequately absorb the incident light. In such a case, a second absorption layer is added to make up for the first absorption layer's inability to absorb sufficient light. In this embodiment, two complete solar cells are placed back to back, on opposite sides of a single plastic substrate, both configured in the superstrate configuration. The outer metallization layer of the upper cell must transmit light through the cell; therefore, a TCO layer having a comb-like arrangement would be necessary for forming the electrical contact of the upper cell. In fact, in order to achieve good ohmic contact between the outer metallization layer of the upper cell and the underlying semiconductor layer, it is preferable that the upper cell be in the superstrate configuration so that a copper metallization layer or other p+ doping layer can be deposited directly on the upper cell's CdTe layer. For example, p+ doping of the upper cell's CdTe contact may be achieved by ion beam doping or by plasma etching to preferentially remove some cadmium and enrich the surface in tellurium.

A solar cell manufactured for commercial deployment in either a substrate or superstrate configuration is preferably constructed as a monolithic network of interconnected cells on a single substrate or superstrate. Use of discrete CdTe solar cells 400, 500 with electrical inter-connectivity provided externally subsequent to the manufacturing of the cells is also possible. Solar cell modules are frequently designed to supply current at a fixed voltage level such as 12 volts, for instance. Enough cells should be connected in series so as to achieve the desired voltage output. The current supplied by an array of amorphous CdTe solar cells 400, 500 will depend upon the amount of solar energy striking the array.

A CdTe solar cell built on a plastic substrate in accordance with this invention is well suited for use wherever solar cells are currently found. Moreover, the flexible plastic substrate permits uses heretofore not seriously thought viable for polycrystalline or crystalline cells. Amorphous CdTe solar cells on plastic substrates are ideal in applications where a flexible, lightweight cell or module is the only feasible choice. Examples include portable radio electronics, where the cell must conform to the curvature of a hand-held device; solar module roof tiles for residential use; mobile telephones, the cell operating to charge the phone's battery; and military applications, providing a solar panel that is rugged and can be deployed by unrolling.

The description and drawings contained herein represent the presently preferred embodiment of the invention and are, as such, a representative of the subject matter which is broadly contemplated by the present invention. The scope of the present invention fully encompasses other embodiments that may become obvious to those skilled in the art, and the scope of the present invention is accordingly limited by nothing other than the appended claims.

What is claimed is:

1. A solar cell comprising:
   a flexible substrate;
   an n-type window layer deposited at a temperature sufficiently low so as not to damage the substrate; and
   a p-type cadmium telluride absorption layer sputter deposited at a temperature sufficiently low to avoid crystallization of the cadmium telluride.

2. A solar cell as claimed in claim 1, wherein the cadmium telluride absorption layer is sputter deposited at or below a temperature of 157 degrees centigrade.

3. A solar cell as claimed in claim 1, wherein the cadmium telluride absorption layer has a thickness in the range of 0.2–10 microns.

4. A solar cell as claimed in claim 1, wherein the n-type window layer comprises cadmium sulfide sputter deposited at a temperature sufficiently low to avoid crystallization of the cadmium sulfide.

5. A solar cell as claimed in claim 1, wherein the n-type window layer is sputter deposited at a temperature at or below 157 degrees centigrade.

6. A solar cell as claimed in claim 1, wherein the n-type window layer has a thickness in the range of 0.1–2 microns.

7. A solar cell as claimed in claim 1, and further comprising a sputter deposited metallization layer.

8. A solar cell as claimed in claim 7, wherein the metallization layer is deposited on the side of the p-type absorption layer opposite the n-type window layer.

9. A solar cell as claimed in claim 7, wherein the metallization layer is deposited between the substrate and the p-type absorption layer.

10. A solar cell as claimed in claim 7, wherein the metallization layer is a thin sputter-deposited film of copper.

11. A solar cell as claimed in claim 7, wherein the metallization layer is sputter deposited using a laser assisted magnetron.

12. A solar cell as claimed in claim 7, wherein the metallization layer is sputter deposited using ion assisted deposition (IAD).

13. A solar cell as claimed in claim 7, wherein the metallization layer has a thickness in the range of 0.2 to 10 microns.

14. A solar cell as claimed in claim 1, and further comprising a thick layer of rugged plastic or polymer bonded to the cell.

15. A solar cell as claimed in claim 14, wherein the thick layer is bonded to the cell underneath the p-type absorption layer.

16. A solar cell as claimed in claim 14, wherein the thick layer is bonded to the cell above the n-type window layer.

17. A solar cell as claimed in claim 14, wherein the thick layer is an opaque polymer.

18. A solar cell as claimed in claim 1, wherein the n-type window layer is deposited onto the substrate and the p-type absorption layer is deposited onto the n-type window layer.

19. A solar cell as claimed in claim 1, wherein the p-type window layer is deposited onto the substrate and the n-type window layer is deposited onto the p-type absorption layer.

20. A solar cell as claimed in claim 1, and further comprising a transparent conductive oxide layer.

21. A solar cell as claimed in claim 20, wherein the transparent conductive oxide layer is deposited between the substrate and the n-type window layer.

22. A solar cell as claimed in claim 20, wherein the transparent conductive oxide layer is deposited onto the n-type window layer.

23. A solar cell as claimed in claim 20, wherein the transparent conductive oxide layer is sputter deposited using a laser assisted magnetron.

24. A solar cell as claimed in claim 20, wherein the transparent conductive oxide layer is sputter deposited using ion assisted deposition (IAD).

25. A solar cell as claimed in claim 20, wherein the transparent conductive oxide layer comprises sputter deposited indium tin oxide.

26. A solar cell as claimed in claim 20, wherein the transparent conductive oxide layer has a sheet resistance of approximately 200 ohms-per-square.

27. A solar cell as claimed in claim 20, and further comprising a network of metal bus bars deposited onto the transparent conductive oxide layer.

28. A solar cell as claimed in claim 27, wherein the network of metal bus bars is sputter deposited using a laser assisted magnetron.

29. A solar cell as claimed in claim 27, wherein the network of metal bus bars is sputter deposited using ion assisted deposition (IAD).

30. A solar cell as claimed in claim 27, wherein the metal bus bars are made of silver.

31. A solar cell as claimed in claim 27, wherein the metal bus bars are configured in a comb arrangement.

32. A solar cell as claimed in claim 27, wherein the bus bars have a separation of 0.19 cm or less.

33. A solar cell as claimed in claim 27, and further comprising an encapsulation layer overlaying the cell to provide an airtight barrier against moisture and other contaminants.

34. A solar cell as claimed in claim 33, wherein the encapsulation layer is applied to the p-type absorption layer side of the cell.

35. A solar cell as claimed in claim 33, wherein the encapsulation layer is applied to the n-type window layer side of the cell.

36. A solar cell as claimed in claim 33, wherein the encapsulation layer is made of ethyl vinyl acetate.

37. A solar cell as claimed in claim 1, and further comprising a graded transition buffer semiconductor layer between the n-type window layer and the p-type absorption layer.

38. A solar cell as claimed in claim 37, wherein the buffer semiconductor layer comprises a blend of approximately fifty atomic percent cadmium telluride and approximately fifty atomic percent cadmium sulfide.

39. A solar cell as claimed in claim 37, wherein the buffer layer has a thickness in the range of 0.02 to 1 microns.

40. A solar cell as claimed in claim 1, and further comprising a second p-type cadmium telluride absorption layer with a band gap differing from the p-type cadmium telluride absorption layer.

41. A solar cell as claimed in claim 1, wherein the n-type window layer and the p-type absorption layer are sputter deposited using a laser assisted magnetron.

42. A solar cell as claimed in claim 1, wherein the n-type window layer and the p-type absorption layer are sputter deposited using ion assisted deposition (IAD).

43. A thin film flexible solar cell comprising:
   a plastic or polymer substrate;
   a thin film of n-type cadmium sulfide deposited at a temperature sufficiently low so as not to damage the substrate; and
   a comparatively thicker film of p-type cadmium telluride deposited at a temperature sufficiently low to avoid crystallization and polycrystallization of the cadmium telluride.

44. A thin film flexible solar cell as claimed in claim 43, wherein the cadmium sulfide and cadmium telluride films are sputter deposited using a laser assisted magnetron.

45. A thin film flexible solar cell as claimed in claim 43, wherein the cadmium sulfide and cadmium telluride films are sputter deposited using ion assisted deposition (IAD).

46. A thin film flexible solar cell as claimed in claim 43, wherein the cadmium sulfide and cadmium telluride films have an amorphous atomic structure.

47. A thin film flexible solar cell as claimed in claim 43, wherein the cadmium sulfide film has a polycrystalline atomic structure.

48. A thin film flexible solar cell as claimed in claim 43, wherein the cadmium sulfide film is polycrystalline and the cadmium telluride film is amorphous.

49. A thin film flexible solar cell as claimed in claim 43, and further comprising:
   a transparent conductive oxide layer; and
   a metallization layer.

50. A thin film flexible solar cell as claimed in claim 49, wherein the transparent conductive oxide layer is deposited between the cadmium sulfide film and the substrate and the metallization layer is deposited on the side of the cadmium telluride film opposite the cadmium sulfide film.

51. A thin film flexible solar cell as claimed in claim 49, wherein the metallization layer is deposited between the cadmium telluride film and the substrate and the transparent conductive oxide layer is deposited onto the cadmium sulfide film.

52. A thin film solar cell as claimed in claim 49, and further comprising:
   a metal bar bus network deposited on the transparent conductive oxide layer;
   a polymer encapsulation layer forming an airtight barrier around the cell; and
   a polymer back layer heat bonded to the encapsulation layer.

53. A thin film solar cell as claimed in claim 52, wherein the metallization layer, the transparent conductive oxide layer, and the metal bus bar network are sputter deposited using a laser assisted magnetron.

54. A thin film solar cell as claimed in claim 52, wherein the metallization layer, the transparent conductive oxide layer, and the metal bus bar network are sputter deposited using ion assisted deposition (IAD).

55. A thin film solar cell as claimed in claim 52, wherein:
   the substrate comprises a plastic or polymer;
   the transparent conductive oxide layer comprises indium tin oxide;
   the metal bus bar network comprises metal bars made of silver;
   the metallization layer comprises copper;
   the encapsulation layer comprises ethyl vinyl acetate; and
   the polymer back layer comprises a plastic or polymer.

56. A thin film solar cell as claimed in claim 52, wherein:
   the substrate has a thickness of approximately five mils;
   the transparent conductive oxide layer has a sheet resistance of approximately 200 ohms-per-square;
   the metal bus bars are configured in a comb arrangement and have a separation of 0.19 cm or less;
   the cadmium sulfide film has a thickness in the range of 0.1–2 microns;
   the cadmium telluride film has a thickness in the range of 0.2–10 microns; and
   the metallization layer has a thickness in the range of 0.2 to 10 microns.

57. A method for manufacturing a thin film flexible solar cell comprising the following steps:
   (a) providing a plastic or polymer substrate;
   (b) depositing a layer of an n-type cadmium sulfide semiconductor on the substrate at a temperature sufficiently low to avoid melting or damaging the substrate; and
   (c) depositing a layer of a p-type cadmium telluride semiconductor on the n-type cadmium sulfide semiconductor layer at a temperature sufficiently low to avoid crystallization and polycrystallization of the cadmium telluride.

58. A method as claimed in claim 57, wherein:
   after step (a), a transparent conductive oxide layer is deposited on the substrate and a metal bar bus network is deposited on the transparent conductive oxide layer; and
   after step (c), a metallization layer is deposited on the p-type semiconductor layer.

59. A method as claimed in claim 58, wherein the n-type semiconductor, the p-type semiconductor, the transparent conductive oxide layer, and the metallization layer are sputter deposited using a laser assisted magnetron.

60. A method as claimed in claim 58, wherein the n-type semiconductor, the p-type semiconductor, the transparent conductive oxide layer, and the metallization layer are sputter deposited using ion assisted deposition (IAD).

61. A method as claimed in claim 57, wherein step (b) involves sputter deposition carried out at a temperature sufficiently low to avoid crystallization of the n-type cadmium sulfide semiconductor.

62. A method as claimed in claim 61, wherein the sputter deposition is carried out at a temperature at or below 157 degrees centigrade.

63. A method as claimed in claim 61, wherein the depositions are carried out at a temperature such that the semiconductor layers have an amorphous structure.

64. A method for manufacturing a thin film flexible solar cell comprising the following steps:
   (a) providing a plastic or polymer substrate;
   (b) depositing a layer of a p-type cadmium telluride semiconductor on the substrate at a temperature sufficiently low to avoid crystallization and polycrystallization of the cadmium telluride; and
   (c) depositing a layer of an n-type cadmium sulfide semiconductor on the p-type cadmium telluride semiconductor at a temperature sufficiently low to avoid melting or damaging the substrate.

65. A method as claimed in claim 64, wherein step (c) involves sputter, deposition carried out at a temperature sufficiently low to avoid crystallization of the n-type cadmium sulfide semiconductor.

66. A thin film flexible solar cell comprising:
   a flexible transparent polymer or plastic substrate;
   a current collection layer deposited onto the substrate;
   an n-type semiconductor film of cadmium sulfide that is sputter deposited at a temperature sufficiently low to avoid melting or damaging the substrate onto the current collection layer and has an amorphous atomic structure;
   a p-type semiconductor film of cadmium telluride having a bandgap energy less than the n-type semiconductor film that is sputter deposited onto the n-type semiconductor film at a temperature sufficiently low to avoid melting or damaging the substrate and has an amorphous atomic structure; and a metallization layer deposited onto the p-type semiconductor film.

67. A thin film flexible solar cell as claimed in claim 66, wherein the n-type semiconductor film, the p-type semiconductor film, the metallization layer, and the current collection layer are sputter deposited using a laser assisted magnetron.

68. A thin film flexible solar cell as claimed in claim 66, wherein the n-type semiconductor film, the p-type semiconductor film, the metallization layer, and the current collection layer are sputter deposited using ion assisted deposition (IAD).

69. A thin film flexible solar cell comprising:
- a flexible transparent polymer or plastic substrate;
- a metallization layer deposited onto the substrate;
- a p-type cadmium telluride semiconductor film that is sputter deposited at a temperature sufficiently low to avoid melting or damaging the substrate onto the metallization layer and has an amorphous atomic structure;
- an n-type cadmium sulfide semiconductor film having a bandgap energy greater than the p-type semiconductor film that is sputter deposited onto the p-type semiconductor layer at a temperature sufficiently low to avoid melting or damaging the substrate and has an amorphous atomic structure; and
- a current collection layer deposited onto the n-type semiconductor film.

70. A thin film flexible solar cell as claimed in claim 69, wherein the p-type semiconductor film, the n-type semiconductor film, the metallization layer, and the current collection layer are sputter deposited using a laser assisted magnetron.

71. A thin film flexible solar cell as claimed in claim 69, wherein the p-type semiconductor film, the n-type semiconductor film, the metallization layer, and the current collection layer are sputter deposited using ion assisted deposition (IAD).

* * * * *